United States Patent [19]
Inada et al.

[11] Patent Number: 5,134,047
[45] Date of Patent: Jul. 28, 1992

[54] METHOD OF MANUFACTURING COLOR CATHODE RAY TUBE

[75] Inventors: Koki Inada, Chiba; Hiroshi Itoh, Tochigi; Hideaki Takazawa, Tochigi; Tadashi Asazuma, Tochigi, all of Japan

[73] Assignee: Sony Corporation, Tokyo, Japan

[21] Appl. No.: 507,882

[22] Filed: Apr. 12, 1990

[30] Foreign Application Priority Data

Oct. 1, 1987 [JP] Japan .................. 62-245786

[51] Int. Cl.$^5$ .................................. G03C 5/00
[52] U.S. Cl. ............................. 430/23; 430/26; 430/28; 430/270
[58] Field of Search .............. 430/23, 26, 28, 270

[56] References Cited
U.S. PATENT DOCUMENTS

| 4,339,524 | 7/1982 | Ichimura et al. | 430/28 |
| 4,423,128 | 12/1983 | Koike et al. | 430/28 |
| 4,777,114 | 10/1988 | Ichimura et al. | 430/28 |
| 5,612,268 | 9/1986 | Miura et al. | 430/28 |

Primary Examiner—Hoa Van Le
Attorney, Agent, or Firm—Hill, Van Santen, Steadman & Simpson

[57] ABSTRACT

In a method of manufacturing a color cathode ray tube utilizing an external surface exposure process, a fluorescent slurry to be applied to a panel contains a photosensitive resin composition composed of an aqueous emulsion of polyvinyl compound resin containing a saponified polyvinyl acetate with an addition-condensed photosensitive group as a protective colloid and an aqueous solution of a saponified polyvinyl acetate with an addition-condensed photosensitive group. Accordingly, a resistance of a fluorescent layer formed on the panel against an aqueous solution of hydrogen peroxide is improved, and an anti-fogging performance of the fluorescent layer is also improved.

16 Claims, 3 Drawing Sheets

METHOD OF MANUFACTURING COLOR CATHODE RAY TUBE

BACKGROUND OF THE INVENTION

The present invention relates to a method of manufacturing a color cathode ray tube having a superhigh definition, and more particularly to such a method which prevents separation of a fluorescent layer formed on a panel by a so-called external surface exposure process and also prevents undue deposition of a fluorescent substance at an undesired portion on the panel.

To reproduce a highly fine image on a color cathode ray tube, it is necessary to clearly form very fine fluorescent stripes (or dots) of three primary colors on a fluorescent face of the color cathode ray tube without separation.

As a conventional method of manufacturing such a color cathode ray tube, there has been disclosed in Japanese Patent Laid-open Publication No. 60-119055 by the present assignee a so-called external surface exposure process wherein mixing of colors between adjacent stripes is prevented by using two kinds of photosensitive resins different in reversing capability with respect to an aqueous solution of hydrogen peroxide. More specifically, a resist layer employing a first photosensitive resin which can be reversed by an aqueous solution of hydrogen peroxide and a fluorescent slurry containing a second photosensitive resin which cannot be reversed by an aqueous solution of hydrogen peroxide and a fluorescent pigment dispersed in the resin are applied to glass panel on which carbon stripes are preliminarily formed in a predetermined sequence, and are hardened by exposure to form a fluorescent face.

Further, there has been disclosed in Japanese Patent Application No. 62-39806 by the present inventors an improvement of the above-mentioned method, wherein a transparent protective coat of a photo-hardening resin which is not reversed by an aqueous solution of hydrogen peroxide is formed on an entire surface of a glass panel on which carbon stripes are preliminarily formed, so as to prevent separation of the carbon stripes.

As to the photosensitive resin which cannot be reversed by an aqueous solution of hydrogen peroxide as used in the above-mentioned methods, there has been disclosed in Japanese Patent Laid-open Publication No. 55-23163, for example, a photosensitive resin formed by introducing a styryl pyridinium into polyvinyl alcohol or partially saponified polyvinyl acetate. There has been also disclosed in Japanese Patent Laid-open Publication No. 61-230138 a photosensitive resin formed by introducing a styryl quinolinium in addition to the above-mentioned styryl pyridinium into partially saponified polyvinyl acetate. A photochemical reaction of these photosensitive resins is based on an optical cross-linking reaction due to dimerization of the styryl pyridinium or the styryl quinolinium introduced as a side chain.

In the above-mentioned external surface exposure process, a reversal treatment by an aqueous solution of hydrogen peroxide is always carried out every time the fluorescent stripe (or dots) of one color is formed. Accordingly, the fluorescent stripe of a first color formed at the first time is subjected to the aqueous solution of hydrogen peroxide again in the subsequent reversal treatment for forming the other fluorescent stripes of the remaining two different colors.

However, in the case of using the photosensitive resin formed by introducing the styryl pyridinium into polyvinyl alcohol, a resistance of the fluorescent stripes against the aqueous solution of hydrogen peroxide is lacking to cause separation of the fluorescent stripes and chipping of edges of the fluorescent stripes. Furthermore, such embrittled fluorescent stripes tend to be separated when they are washed under an increased water pressure after the reversal treatment by the aqueous solution of hydrogen peroxide.

On the other hand, when a chemical resistance against the aqueous solution of hydrogen peroxide, etc. is intended to be improved, a resolubility to water is reduced to cause a problem such that the fluorescent substance is foggily deposited to an undesired portion on the panel (which will be hereinafter referred to as fogging).

SUMMARY OF THE INVENTION

It is accordingly an object of the present invention to provide a method of manufacturing a color cathode ray tube having a high-quality color fluorescent face improved in resistance against an aqueous solution of hydrogen peroxide and anti-fogging performance.

The present inventors have found that both the resistance against an aqueous solution of hydrogen peroxide and the anti-fogging performance can be improved to achieve the above object by using a fluorescent slurry containing a mixture of an aqueous emulsion of polyvinyl compound resin which emulsion contains a saponified polyviny acetate with an addition-condensed photosensitive group as a protective colloid and an aqueous solution of the saponified polyvinyl acetate with the addition-condensed photosensitive group.

According to the present invention, there is provided in a method of manufacturing a color cathode ray tube including the steps of forming a light absorbing layer of a predetermined pattern on an internal surface of a panel, forming a resist layer at a remaining portion other than a portion of said light absorbing layer on which a fluorescent layer containing a fluorescent substance of a first color is to be formed, coationg a fluorescent slurry containing a mixture of said fluorescent substance of said first color with a photosensitive agent which cannot be removed by a reversing agent of said resist layer, exposing a full external surface of said panel to light for development, removing said resist layer with said fluorescent layer formed at said remaining portion to form a fluorescent stripe of said first color, and similarly forming a fluorescent stripe of at least a second color; the improvement characterized in that said photosensitive agent comprises a photosensitive resin composition composed of a first component and a second component, said first component being an aqueous emulsion of polyvinyl compound resin containing a saponified polyvinyl acetate with an addition-condensed photosensitive group as a protective colloid, said second component being an aqueous solution of a saponified polyvinyl acetate with an addition-condensed photosensitive group.

The above-mentioned saponified polyvinyl acetate is at least one kind of photosensitive saponified polyvinyl acetate containing a saponified polyvinyl acetate as a main chain, at least one kind of photosensitive unit bonded to said main chain, and at least one kind of hydrophobic unit bonded to said main chain.

The photosensitive unit is represented by the following formula (I).

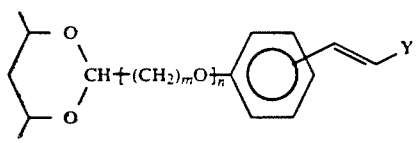

In the formula (I),

represents a vinyl alcohol unit in a main chain of the saponified polyvinyl acetate. The saponified polyvinyl acetate has a saponification degree of preferably 50-100%. If the saponification degree is less than 50%, the water-solubility is reduced. Further, the saponified polyvinyl acetate has a polymerization degree of preferably 300-4000.

In the formula (I), m represents an integer of 1-6, and n represents 0 or 1. The photosensitive unit represented by the formula (I) is formed by dehydration condensation of two hydroxyl groups in a molecule of polyvinyl acetate and aldehyde.

In the formula (I), Y is represented by the following formula (II) or (III).

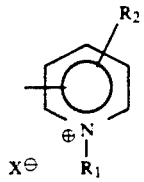

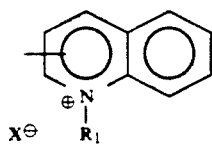

The formula (II) represents styryl pyridinium derivatives, while the formula (III) represents styryl quinolinium. $R_1$ represents a hydrogen atom, unsubstituted alkyl group, unsubstituted aralkyl group, or substituted alkyl or aralkyl group having a hydroxyl group, carbamoyl group, ether linkage or unsaturated linkage; $R_2$ represents a hydrogen atom or lower alkyl group; and $X^-$ represents an anion such as a chlorine, bromine, sulfate, phosphate, perchlorate, metosulfate, p-toluene sulfonate or borohydrofluorate ion.

A substitutional amount of the vinyl alcohol unit contained in a vinyl constituent of the saponified polyvinyl acetate to be substituted by the photosensitive unit is in a range of preferably 0.1-50 mol %. If the substitutional amount is less than 0.1 mol %, the photosensitivity is reduced, while if the substitutional amount is greater than 50 mol %, the water-solubility is reduced to cause a remarkable increase in viscosity, resulting in difficult handling.

If the photosensitive saponified polyvinyl acetate having the photosensitive unit represented by the formula (I) is used as it is as the protective colloid for the polyvinyl compound resin, gellation tends to occur, and it is accordingly hard to handle the saponified polyvinyl acetate in a medium consisting of water only. Therefore, a hydrophobic unit to be represented by the following formula (IV), (V) or (VI) is introduced into the main chain of the saponified polyvinyl acetate.

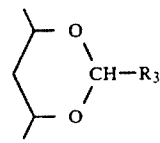

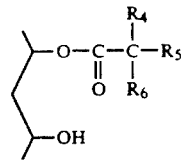

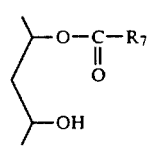

In the formulas (IV), (V) and (VI),

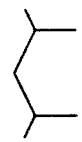

represents a vinyl alcohol residual group in the main chain of the saponified polyvinyl acetate.

The formula (IV) represents a hydrophobic unit having an acetal structure. In the formula (IV), $R_3$ represents a hydrogen atom, alkyl, allyl, phenyl, carboxyphenyl, sulfoxyphenyl, aminophenyl, nitrophenyl, halogenated phenyl, styryl, tolyl, benzyl, xylyl, naphthyl or anthryl group. This hydrophobic unit can be synthesized by dehydration condensation between the main chain of the saponified polyvinyl acetate and aldehyde compounds such as butyl aldehyde, octyl aldehyde, heptyl aldehyde, nonyl aldehyde, benz aldehyde, naphthyl aldehyde, aminobenz aldehyde, nitrobenz aldehyde, carboxybenz aldehyde or sulfoxybenz aldehyde.

On the other hand, the formula (V) and (VI) represent a hydrophobic unit having an acyl group. In the formula (V), $R_4$, $R_5$ and $R_6$ represent different alkyls including the case where one of them is a hydrogen atom. In the formula (VI), $R_7$ represents an alkyl, allyl, propionyl, phenyl, halogenated phenyl, benzyl, styryl, xylyl, tolyl, benzoyl, naphthyl or anthryl group. These hydrophobic units can be synthesized by acylation using chlorides such as acetyl chloride, propionyl chloride and benzoyl chloride, or acid anhydrides such as acetic anhydride and benzoic anhydride.

A substitutional amount of the vinyl alcohol unit contained in a vinyl constituent of the saponified polyvinyl acetate to be substituted by the hydrophobic unit is in a range of preferably 0.1-30 mol %. If the substitutional amount is less than 0.1 mol %, the resistance against an aqueous solution of hydrogen peroxide is reduced, while if the substitutional amount is greater than 30 mol %, the water-solubility is reduced to cause a remarkable increase in viscosity, resulting in difficult handling.

Thus, at least one kind of the photosensitive unit and at least one kind of the hydrophobic unit are introduced into the main chain of the saponified polyvinyl acetate to obtain the saponified polyvinyl acetate, and the saponified polyvinyl acetate is employed as a protective colloid for the polyvinyl compound resin in the aqueous emulsion thereof. Examples of the polyvinyl compound resin may include polyvinyl acetate, vinylacetate-ethylene copolymer, vinyl acetate-acrylic acid copolymer, vinyl acetate-acrylic ester copolymer, polyacrylate, acrylic acid-acrylic ester copolymer, polystyrene, styrene-acrylic acid copolymer, styrene-acrylic ester copolymer, polyvinyl chloride, polyvinylidene chloride, vinyl acetate-methacrylic acid copolymer, vinyl acetate-methacrylic ester copolymer, styrenebutadiene copolymer and acrylonitrile-butadiene copolymer.

A solid content of the protective colloid with respect to the polyvinyl compound resin is in a range of preferably 5-99 wt %. If the solid content is less than 5 wt %, a sufficient viscosity cannot be obtained because of shortage of the protective colloid, resulting in difficulty in uniform coating. If the solid content is greater than 99 wt %, the resistance against an aqueous solution of hydrogen peroxide is lacking.

In the present invention, the second component as an aqueous solution of the photosensitive resin is mixed with the first component as the above-mentioned aqueous emulsion. A saponification degree of the photosensitive saponified polyvinyl acetate contained in the second component and contents of the photosensitive unit and the hydrophobic unit in the saponified polyvinyl acetate are similar to those in the first component. However, a polymerization degree of the saponified polyvinyl acetate in the second component is preferably not greater than 2500. If the polymerization degree is greater than 2500, a fluorescent substance tends to be deposited onto any regions other than a desired region on the fluorescent face, that is, the fogging tends to occur.

Further, a solid content reduced weight ratio of the first component to the second component is in a range of preferably 100:1-10:100. If the weight ratio of the first component to the second component is greater than 100:1, the fogging tends to occur, while if the weight ratio of the second component to the first component is greater than 100:10, the resistance against an aqueous solution of hydrogen peroxide is reduced.

In the method of manufacturing a color cathode ray tube according to the present invention, the fluorescent slurry contains a mixture of an aqueous emulsion of polyvinyl compound resin which emulsion contains a saponified polyvinyl acetate with an addition-condensed photosensitive group as a protective colloid and an aqueous solution of the saponified polyvinyl acetate with the addition-condensed photosensitive group, and the fluorescent layer is formed by applying the fluorescent slurry onto the panel. Accordingly, the resistance of the fluorescent layer against the aqueous solution of hydrogen peroxide can be remarkably improved, and the anti-fogging performance can also be improved. Although the reason of this phenomenon is not sufficiently clarified, it can be considered as follows:

It is considered that the saponified polyvinyl acetate as the protective colloid is integrally bonded by graft linkage to the polyvinyl compound resin present in particles of the aqueous emulsion. Accordingly, a molecular weight of the polymer resin is very high, thereby improving the chemical resistance against the aqueous solution of hydrogen peroxide, etc. However, there occurs a problem such that the resolubility to water is reduced because of such a high molecular weight to cause easy occurrence of the fogging. To solve this problem, the second component is added to the first component. That is, an aqueous solution of the photosensitive resin having a relatively low molecular weight in the second component is mixed with the first component in a suitable quantitative range so as not to reduce the chemical resistance of the first component. As a result, it is considered that the resolubility to water can be improved to improve the antifogging performance.

In summary, according to the present invention, as the fluorescent slurry containing a mixture of an aqueous emulsion containing the photosensitive resin as a protective colloid and an aqueous solution of the photosensitive resin is used in the manufacture of a color cathode ray tube, the resistance against an aqueous solution of hydrogen peroxide can be remarkably improved, and the deposition property with respect to the carbon stripes can be suitably controlled to thereby prevent the fogging.

Accordingly, a color cathode ray tube having a good picture quality can be manufactured without changing an external surface exposure process.

Other objects and features of the invention will be more fully understood from the following detailed description and appended claims when taken with the accompanying drawings.

BRIEF DESCRIPTION OF THE DRAWINGS

FIGS. 1A to 1I are sectional views illustrating an example of a procedure of the manufacture of a color cathode ray tube according to the present invention in which:

FIG. 1A is a sectional view illustrating a forming step of carbon stripes;

FIG. 1B is a sectional view illustrating a forming step of a protective coat;

FIG. 1C is a sectional view illustrating a coating step of a polyvinyl alcohol photosensitive liquid;

FIG. 1D is a sectional view illustrating an internal surface exposing step;

FIG. 1E is a sectional view illustrating a forming step of a resist layer;

FIG. 1F is a sectional view illustrating a coating step of a green fluorescent slurry and an external surface exposing step;

FIG. 1G is a sectional view illustrating a developing step;

FIG. 1H is a sectional view illustrating a forming step of a green fluorescent stripe by reversal; and FIG. 1I is a sectional view illustrating a condition where red and blue flow stripes as well as the green fluorescent stripe are finally formed.

DETAILED DESCRIPTION OF THE PREFERRED EMBODIMENTS

Figure 1A:
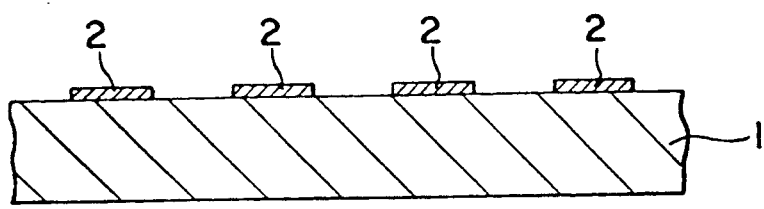

There will now be described some examples of the present invention with reference to the drawings.

EXAMPLE 1

In Example 1, N-methyl-4-(p-formylstyryl) pyridinium methosulfate was employed as the photosensitive unit, and m-nitrobenz aldehyde was employed as the hydrophobic unit for the preparation of the first component. These units were introduced into saponified polyvinyl acetate to obtain a saponified polyvinyl acetate. An aqueous emulsion of polyvinyl acetate containing the saponified polyvinyl acetate thus obtained was employed as the first component wherein the saponified polyvinyl acetate serves as a protective colloid for the polyvinyl acetate which is an example of polyvinyl compound resin. On the other hand, N-methyl-4-(p-formylstyryl) pyridinium methosulfate was employed as the photosensitive unit, and butyl aldehyde was employed as the hydrophobic unit for the preparation of the second component. These units were introduced into saponified polyvinyl acetate to obtain a saponified polyvinyl acetate. An aqueous solution of the saponified polyvinyl acetate thus obtained was employed as the second component.

First, the first component was prepared in the following manner. Emulsion polymerization of vinyl acetate and saponified polyvinyl acetate (saponification degree of 88%; polymerization degree of 1800) was conducted in the presence of a thermal polymerization initiator such as potassium persulfate in the usual way to prepare an aqueous emulsion of polyvinyl acetate. The thus obtained aqueous emulsion contained the polyvinyl acetate obtained by polymerization of the vinyl acetate and the saponified polyvinyl acetate in a weight ratio of 20:80, and had a solid content concentration of 17%. In 1 kg of the aqueous emulsion of polyvinyl acetate were dissolved 13.6 g (0.041 moles) of N-methyl-4-(p-formylstyryl) pyridinium methosulfate and 5.44 g (0.036 moles) of m-nitrobenz aldehyde. Then, pH of this aqueous emulsion was adjusted to 2.5 by using phosphoric acid, and the aqueous emulsion was stirred for reaction at 60° C. for 20 hours. This reaction resulted in the introduction of the N-methyl-4-(p-formylstyryl) pyridinium methosulfate as the photosensitive unit and the m-nitrobenz aldehyde as the hydrophobic unit into the saponified polyvinyl acetate by dehydration condensation. After the completion of the reaction, pH of the reaction liquid was adjusted to 6–7 by using aqueous ammonia, and the resultant liquid was employed for the first component.

Next, the second component was prepared in the following manner. In 870 g of water was dissolved 130 g of saponified polyvinyl acetate (saponification degree of 88%; polymerization degree of 500) to obtain an aqueous solution having a solid content concentration of 13%. Then, in the aqueous solution were dissolved 52 g (0.16 moles) of N-methyl-4-(p-formylstyryl) pyridinium methosulfate and 2.6 g (0.036 moles) of butyl aldehyde. Then, pH of the aqueous solution was adjusted to 2.5 by using phosphoric acid, and the aqueous solution was stirred for reaction at 60° C. for 20 hours. This reaction resulted in the introduction of the N-methyl-4-(p-formylstyryl) pyridinium methosulfate as the photosensitive unit and the butyl aldehyde as the hydrophobic unit into the saponified polyvinyl acetate by dehydration condensation. After the completion of the reaction, pH of the reaction liquid was adjusted to 6–7 by using aqueous ammonia, and the resultant liquid was employed for the second component.

Next, 80 g of the first component and 20 g of the second component were mixed together to prepare a photosensitive resin composition for forming a fluorescent face of a color cathode ray tube.

By using this photosensitive resin composition, a carbon stripe type color cathode ray tube was prepared.

First, as shown in FIG. 1A, carbon stripes 2 were formed on a glass panel 1 in the usual way.

Figure 1B:
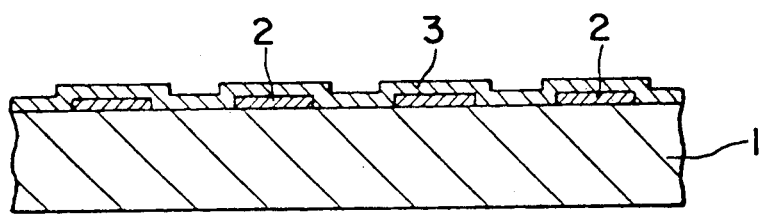

Then, as shown in FIG. 1B, a protective coat 3 for preventing separation of the carbon stripes 2 was formed on the glass panel 1. That is, a 0.5–3% aqueous solution of photosensitive resin such as polyvinyl pyrrolidone-azide photosensitive resin, diazo photosensitive resin and polyvinyl alcohol-stilbazolium photosensitive resin was applied to an entire internal surface of the glass panel, and the glass panel 1 was then irradiated by a light source having a suitable wavelength to polymerize the photosensitive resin, thus forming the protective coat 3 of 0.2–1 μm thick.

Figure 1C:
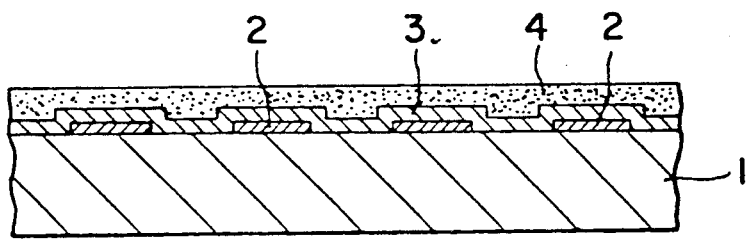

Then, as shown in FIG. 1C, a 6 wt % polyvinyl alcohol photosensitive liquid 4 containing a small quality of ammonium bichromate was applied to the protective coat 3, and was then dried.

Figure 1D:
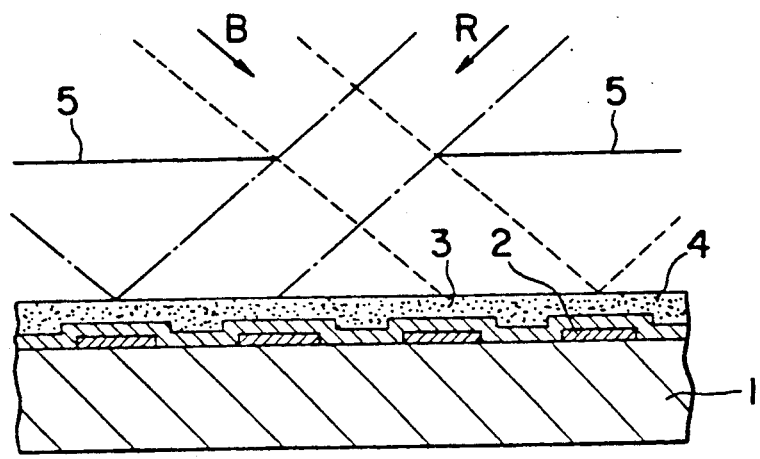
Figure 1E:
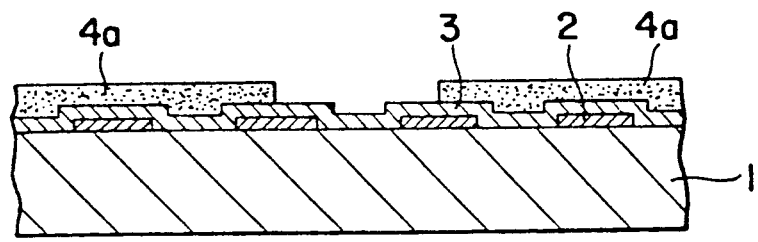

Then, as shown in FIG. 1D, a coat of the photosensitive liquid 4 was exposed to light by using an aperture grill 5 as an optical mask in the usual way. In the case of forming a green fluorescent stripe, for example, the coat 4 was covered with the aperture grill 5 at the positions corresponding to red and blue stripes, and the light was applied to the coat 4 in both the directions R (red) and B (blue) as shown in FIG. 1D. An exposed portion of the coat 4 was hardened by photopolymerization to form a resist layer 4a, while an unexposed portion was washed off to obtain a condition shown in FIG. 1E. The resist layer 4a can be reversed (dissolved off) by an aqueous solution of hydrogen peroxide.

Figure 1F:
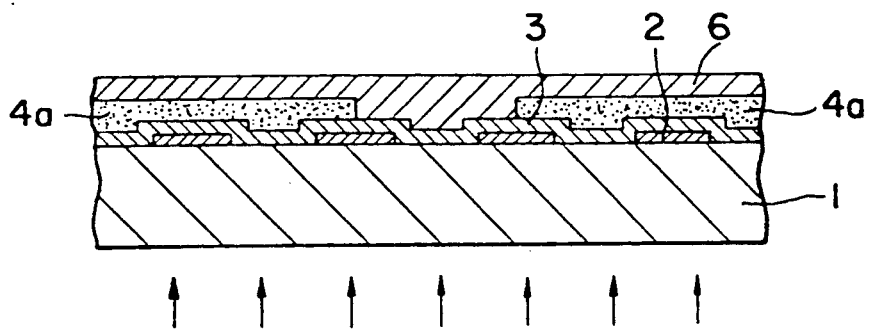

Then, a green fluorescent slurry for forming the green fluorescent stripe was prepared. That is, 250 ml (solid content concentration of 11%) of the photosensitive resin composition composed of the first component and the second component prepared previously, 500 ml of water and 400 g of a green fluorescent substance were mixed together, and 10 ml of a 10% surface active agent as a dispersing agent was added to the mixture, thus preparing the green fluorescent slurry. Then, as shown in FIG. 1F, the green fluorescent slurry 6 thus prepared was applied to an entire internal surface of the panel, and an entire external surface of the panel was exposed to light. This fluorescent slurry is not reversed by an aqueous solution of hydrogen peroxide after it is hardened by photopolymerization.

Figure 1G:
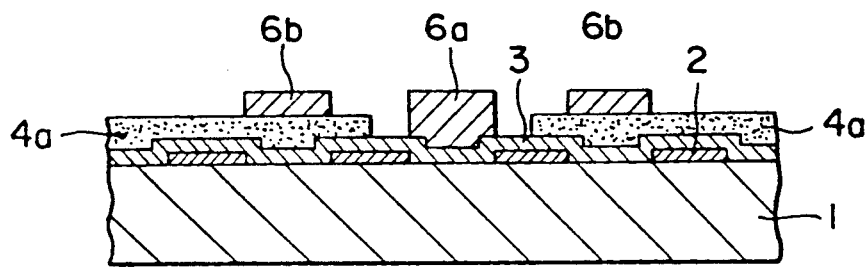

Then, as shown in FIG. 1G, the panel was developed to remove an unexposed portion of the green fluorescent slurry 6 except a green fluorescent stripe 6a and a green fluorescent hardened portion 6b hardened by photopolymerization.

Figure 1H:
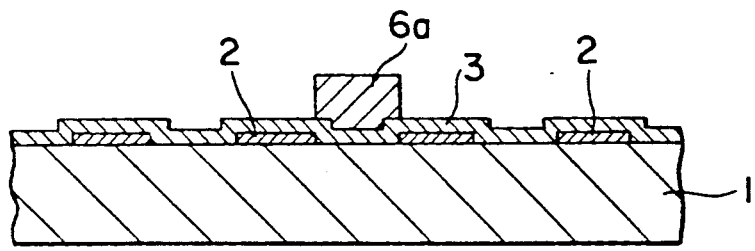

Then, a 12% aqueous solution of hydrogen peroxide as a reversing agent was poured on the panel, and the panel is then allowed to stand at 40° C. for 2 minutes. Subsequently, the panel was washed under a predetermined water pressure. Thus, the resist layer 4a with the green fluorescent hardened portion 6b was removed to obtain a condition shown in FIG. 1H.

Figure 1I:
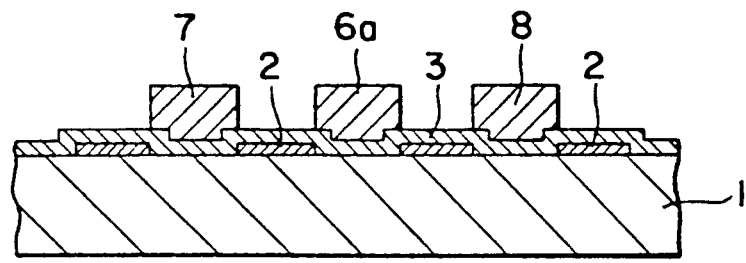

Then, the above steps from FIG. 1C to FIG. 1H for the other colors were similarly repeated to finally obtain a condition shown in FIG. 1I wherein a red fluorescent stripe 7 and a blue fluorescent stripe 8 in addition to the green fluorescent stripe 6a were formed. Thus, the fluorescent face was completed.

In the fluorescent face of the color cathode ray tube formed in Example 1, neither separation of the fluorescent stripes nor chipping of edges of the fluorescent stripes was generated even through the repeated reversal by the aqueous solution of hydrogen peroxide and washing under a water pressure of 7 kg/cm$^2$ after the reversal. Further, excessive deposition (i.e., fogging) of the fluorescent slurry onto the carbon stripes were not perceived.

EXAMPLE 2

For the preparation of both the first component and the second component in Example 2, N-methyl-4-(p-formylstyryl) pyridinium methosulfate as the photosensitive unit and butyl aldehyde as the hydrophobic unit were introduced into saponified polyvinyl acetate.

First, the first component was prepared in the following manner. Emulsion polymerization of vinyl acetate and saponified polyvinyl acetate (saponification degree of 88%; polymerization degree of 1400) was conducted in the presence of a thermal polymerization initiator such as potassium persulfate in the usual way to prepare an aqueous emulsion of polyvinyl acetate. The thus obtained aqueous emulsion contained the polyvinyl acetate obtained by polymerization of the vinyl acetate and the saponified polyvinyl acetate in a weight ratio of 40:60, and had a solid content concentration of 17%. In 1 kg of the aqueous emulsion of polyvinyl acetate were dissolved 10.2 g (0.030 moles) of N-methyl-4-(p-formylstyryl) pyridinium methosulfate and 3.06 g (0.043 moles) of butyl aldehyde. Then, this aqueous emulsion obtained above was subjected to the reaction similar to that mentioned in Example 1, thus preparing the first component.

Next, the second component was prepared in the following manner. In 870 g of water was dissolved 130 g of saponified polyvinyl acetate (saponification degree of 88%; polymerization degree of 500) to obtain an aqueous solution having a solid content concentration of 13%. Then, in the aqueous solution were dissolved 39 g (0.12 moles) of N-methyl-4-(p-formylstyryl) pyridinium methosulfate and 5.2 g (0.072 moles) of butyl aldehyde. Then, this aqueous solution was subjected to the reaction similar to that mentioned in Example 1, thus preparing the second component.

Next, 80 g of the first component and 20 g of the second component were mixed together to prepare a photosensitive resin composition for forming a fluorescent face of a color cathode ray tube.

By using this photosensitive resin composition, the fluorescent face of the color cathode ray tube was formed in accordance with the same procedure as mentioned previously. The fluorescent face exhibited a good result similar to the result mentioned in Example 1.

COMPARISON 1

In Comparison 1, the first component only as prepared in Example 1 was employed for the photosensitive resin composition.

First, an aqueous emulsion of polyvinyl acetate was prepared in accordance with the process mentioned in Example 1. That is, emulsion polymerization of vinyl acetate and saponified polyvinyl acetate (saponification degree of 88%; polymerization degree of 1800) was conducted in the presence of a thermal polymerization initiator such as potassium persulfate in the usual way to prepare the aqueous emulsion of polyvinyl acetate. The thus obtained aqueous emulsion contained the polyvinyl acetate obtained by polymerization of the vinyl acetate and the saponified polyvinyl acetate in a weight ratio of 20:80, and had a solid content concentration of 17%. In 1 kg of the aqueous emulsion of polyvinyl acetate were dissolved 13.6 g (0.041 moles) of N-methyl-4-(p-formylstyryl) pyridinium methosulfate and 5.44 g (0.036 moles) of m-nitrobenz aldehyde. Then, pH of this aqueous emulsion was adjusted to 2.5 by using phosphoric acid, and the aqueous emulsion was stirred for reaction at 60° C. for 20 hours. This reaction resulted in the introduction of the N-methyl-4-(p-formylstyryl) pyridinium methosulfate as the photosensitive unit and the m-nitrobenz aldehyde as the hydrophobic unit into the saponified polyvinyl acetate by dehydration condensation. After the completion of the reaction, pH of the reaction liquid was adjusted to 6–7 by using aqueous ammonia.

By using this aqueous emulsion, a fluorescent slurry was prepared to form a fluorescent face in the same manner as in Example 1. As to the fluorescent face thus obtained, neither separation of the flurorescent stripes nor chipping of edges of the fluorescent stripes was generated. However, excessive deposition (fogging) of the fluorescent slurry onto the carbon stripes was perceived. This defect is due to the fact that since the second component containing free saponified polyvinyl acetate was not added, a deposition property of the fluorescent slurry could not be suitably controlled.

COMPARISON 2

In Comparison 2, the aqueous emulsion of polyvinyl acetate was not used but the second component only as an aqueous solution of saponified polyvinyl acetate was used.

The second component was prepared in the following manner. In a mixture liquid composed of 800 g of water and 100 g of ethanol was dissolved 100 of saponified polyvinyl acetate (saponification degree of 88%; polymerization degree of 1800). Then, in this solution were dissolved 10 g (0.030 moles) of N-methyl-4-(p-formylstyryl) pyridinium methosulfate and 4 g (0.026 moles) of m-nitrobenz aldehyde. Then, pH of the aqueous solution was adjusted to 2.5 by using phosphoric acid, and the aqueous solution was stirred for reaction at 60° C. for 2 hours. This reaction resulted in the introduction of the N-methyl-4-(p-formylstyryl) pyridinium methosulfate as the photosensitive unit and the m-nitrobenz aldehyde as the hydrophobic unit into the saponified polyvinyl acetate by dehydration condensation. After the completion of the reaction, pH of the reaction liquid was adjusted to 6–7 by using aqueous ammonia.

By using this aqueous solution obtained above, a fluorescent slurry was similarly prepared to form a fluorescent face. In the course of forming the fluorescent face, separation of the fluorescent stripes was generated in the step of washing under a water pressure of 5 kg/cm$^2$. This defect is due to the fact that since the first component containing saponified polyvinyl acetate serving as a protective colloid was not added, the resistance of the fluorescent slurry against the aqueous solution of hydrogen peroxide was not sufficiently ensured.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. In a method of manufacturing a color cathode ray tube including the steps of forming a light absorbing layer of a predetermined pattern on an internal surface of a panel, forming a resist layer at a remaining portion other than a portion of said light absorbing layer on which a fluorescent layer containing a fluorescent substance of a first color is to be formed, coating a fluorescent slurry containing a mixture of said fluorescent substance of said first color with a photosensitive agent which cannot be removed by a reversing agent of said resist layer, exposing a full external surface of said panel to light for development, removing said resist layer with said fluorescent layer formed at said remaining portion to form a fluorescent strip of said first color, and similarly forming a fluorescent stripe of at least a second color; the improvement characterized in that said photosensitive agent comprises a photosensitive resin composition composed of a first component and a second component, said first component being an aqueous emulsion of polyvinyl compound resin containing a saponified polyvinyl acetate with an addition-condensed photosensitive group as a protective colloid, said second component being an aqueous solution of a saponified polyvinyl acetate with an addition-condensed photosensitive group, the weight ratio of the first component to the second component is in a range of about 100:1-10:100.

2. the method as defined in claim 1, wherein said saponified polyvinyl acetate as said protective colloid is at least one kind of photosensitive saponified polyvinyl acetate containing a saponified polyvinyl acetate as a main chain, at least one kind of photosensitive unit bonded to said main chain, and at least one kind of hydrophobic unit bonded to said main chain.

3. The method as defined in claim 2, wherein said photosensitive unit is represented by the following general formula (I).

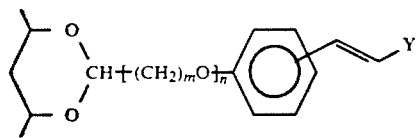
(I)

where in said formula (I)

represents a vinyl alcohol unit in said main chain of said saponified polyvinyl acetate; m represents an integer of 1-6; n represents 0 or 1; and Y is represented by the following formula (II) or (III);

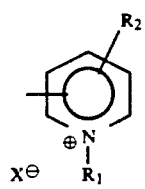
(II)

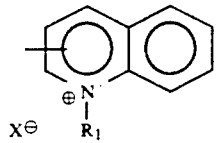
(III)

where in said formulas (II) and (III) $R_1$ represents a hydrogen atom, unsubstituted alkyl group, unsubstituted aralkyl group, or substituted alkyl or aralkyl group having a hydroxyl group, carbamoyl group, ether linkage or unsaturated linkage; $R_2$ represents a hydrogen atom or lower alkyl group; and $X^-$ represents an anion.

4. The method as defined in claim 2, wherein said hydrophobic unit is represented by the following general formula (IV), (V) or (VI).

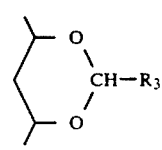
(IV)

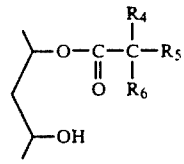
(V)

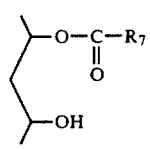
(VI)

where in said formulas (IV), (V) and (VI)

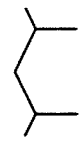

represents a vinyl alcohol unit in said main chain of said saponified polyvinyl acetate; $R_3$ represents a hydrogen atom, alkyl, allyl, phenyl, carboxyphenyl, sulfoxyphenyl, aminophenyl, nitrophenyl, halogenated phenyl, styryl, tolyl, benzyl, xylyl, naphthyl or anthryl group; $R_4$, $R_5$ and $R_6$ represent different alkyls including the case where one of them is a hydrogen atom; and $R_7$ represents an alkyl, allyl, propionyl, phenyl, halogenated phenyl, benzyl, styryl, xylyl, tolyl, benzoyl, naphthyl or anthryl group.

5. The method as defined in claim 1, wherein a solid content of said protective colloid with respect to said polyvinyl compound resin is in a range of 5-99 wt %.

6. The method as defined in claim 2, wherein a saponification degree of said saponified polyvinyl acetate as said main chain of said saponified polyvinyl acetate is 50-100%.

7. The method as defined in claim 2, wherein 0.1-50 mol % of a vinyl alcohol unit contained in a vinyl constituent of said saponified polyvinyl acetate is substituted by said photosensitive unit.

8. The method as defined in claim 2, wherein 0.1-30 mol % of a vinyl alcohol unit contained in a vinyl constituent of said saponified polyvinyl acetate is substituted by said hydrophobic unit.

9. The method as defined in claim 2, wherein a polymerization degree of said saponified polyvinyl acetate is in a range of 300-4000.

10. The method as defined in claim 1, wherein said saponified polyvinyl acetate contained in said second component is at least one kind of photosensitive saponified polyvinyl acetate containing a saponified polyvinyl acetate as a main chain, at least one kind of photosensitive unit bonded to said main chain, and at least one kind of hydrophobic unit bonded to said main chain.

11. The method as defined in claim 10, wherein said photosensitive unit is represented by the following general formula (I).

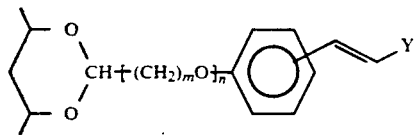   (I)

where in said formula (I)

represents a vinyl alcohol unit in said main chain of said saponified polyvinly acetate; m represents an integer of 1-6; n represents 0 or 1; and Y is represented by the following formula (II) or (III);

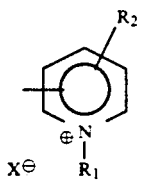   (II)

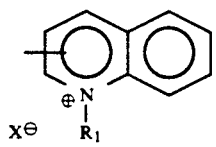   (III)

where in said formulas (II) and (III) $R_1$ represents a hydrogen atom, unsubstituted alkyl group, unsubstituted aralkyl group, or substituted alkyl or aralkyl group having a hydroxyl group, carbamoyl group, ether linkage or unsaturated linkage; $R_2$ represents a hydrogen atom or lower alkyl group; and $X^-$ represents an anion.

12. The method as defined in claim 10, wherein said hydrophobic unit is represented by the following general formula (IV), (V) or (VI).

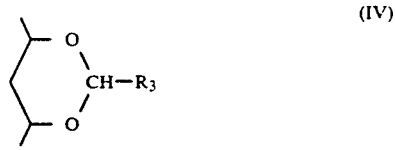   (IV)

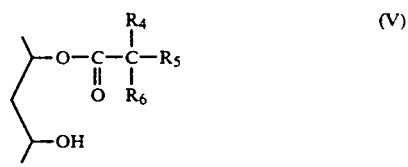   (V)

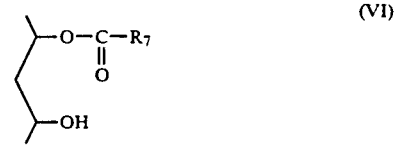   (VI)

where in said formulas (IV), (V) and (VI)

represents a vinyl alcohol unit in said main chain of said saponified polyvinyl acetate; $R_3$ represents a hydrogen atom, alkyl, allyl, phenyl, carboxyphenyl, sulfoxyphenyl, aminophenyl, nitrophenyl, halogenated phenyl, styryl, tolyl, benzyl, xylyl, naphthyl or anthryl group; $R_4$, $R_5$ and $R_6$ represent different alkyls including the case where one of them is a hydrogen atom; and $R_7$ represents an alkyl, allyl, propionyl, phenyl, halogenated phenyl, benzyl, styryl, xylyl, tolyl, benzoyl, naphthyl or anthryl group.

13. The method as defined in claim 10, wherein a saponification degree of said saponified polyvinyl acetate as said main chain of said saponified polyvinyl acetate is 50-100%.

14. The method as defined in claim 10, wherein 0.1-50 mol % of a vinyl alcohol unit contained in a vinyl constituent of said saponified polyvinyl acetate is substituted by said photosensitive unit.

15. The method as defined in claim 10, wherein 0.1-30 mol % of a vinyl alcohol unit contained in a vinyl constituent of said saponified polyvinyl acetate is substituted by said hydrophobic unit.

16. The method as defined in claim 10, wherein a polymerization degree of said saponified polyvinyl acetate is not greater than 2500.

* * * * *